United States Patent
Chen et al.

(10) Patent No.: US 11,066,743 B2
(45) Date of Patent: Jul. 20, 2021

(54) SELECTIVE ATOMIC LAYER DEPOSITION OF RUTHENIUM

(71) Applicant: Applied Materials, Inc., Santa Clara, CA (US)

(72) Inventors: Yihong Chen, San Jose, CA (US); Yong Wu, Sunnyvale, CA (US); Srinivas Gandikota, Santa Clara, CA (US); Abhijit Basu Mallick, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 108 days.

(21) Appl. No.: 16/220,794

(22) Filed: Dec. 14, 2018

(65) Prior Publication Data
US 2019/0185993 A1  Jun. 20, 2019

Related U.S. Application Data

(60) Provisional application No. 62/599,691, filed on Dec. 16, 2017.

(51) Int. Cl.
| | |
|---|---|
| C23C 16/18 | (2006.01) |
| C23C 16/455 | (2006.01) |
| C23C 16/04 | (2006.01) |
| C23C 14/00 | (2006.01) |
| C23C 16/458 | (2006.01) |
| C23C 16/02 | (2006.01) |

(Continued)

(52) U.S. Cl.
CPC .......... *C23C 16/18* (2013.01); *C23C 14/0047* (2013.01); *C23C 16/0272* (2013.01); *C23C 16/04* (2013.01); *C23C 16/4584* (2013.01); *C23C 16/45519* (2013.01); *C23C 16/45529* (2013.01); *C23C 16/45551* (2013.01); *C23C 16/45553* (2013.01); *C07F 15/0046* (2013.01); *C23C 16/45542* (2013.01); *H01B 1/06* (2013.01)

(58) Field of Classification Search
CPC ... C23C 16/04; C23C 16/18; C23C 16/45525; C23C 16/45529
See application file for complete search history.

(56) References Cited

U.S. PATENT DOCUMENTS

| 7,737,028 B2 | 6/2010 | Wang et al. |
| 8,927,403 B2 | 1/2015 | Huotari et al. |
| (Continued) | | |

FOREIGN PATENT DOCUMENTS

| KR | 20020011931 A | 2/2002 |
| KR | 20090093148 A | 9/2009 |
| (Continued) | | |

OTHER PUBLICATIONS

PCT International Search Report and Written Opinion in PCT/US2018/065681 dated Apr. 15, 2019, 11 pages.

*Primary Examiner* — Elizabeth A Burkhart
(74) *Attorney, Agent, or Firm* — Servilla Whitney LLC

(57) ABSTRACT

Methods of selectively depositing ruthenium are described. The preferred deposition surface changes based on the substrate temperature during processing. At high temperatures, ruthenium is deposited on a first surface of a conductive material over a second surface of an insulating material. At lower temperatures, ruthenium is deposited on an insulating surface over a conducting surface.

18 Claims, 6 Drawing Sheets

(51) Int. Cl.
   *H01B 1/06*    (2006.01)
   *C07F 15/00*   (2006.01)

(56) References Cited

U.S. PATENT DOCUMENTS

| | | | | |
|---|---|---|---|---|
| 2008/0245304 | A1* | 10/2008 | Yonker | H01L 21/28562 |
| | | | | 118/725 |
| 2012/0009773 | A1* | 1/2012 | Huotari | C23C 16/32 |
| | | | | 438/592 |
| 2013/0011557 | A1* | 1/2013 | Farm | G03F 7/0002 |
| | | | | 427/250 |
| 2015/0299848 | A1* | 10/2015 | Haukka | C23C 16/407 |
| | | | | 427/123 |

FOREIGN PATENT DOCUMENTS

| WO | 2006081234 | A2 | 8/2006 |
|---|---|---|---|
| WO | 2009094325 | A1 | 7/2009 |

* cited by examiner

SELECTIVE ATOMIC LAYER DEPOSITION OF RUTHENIUM

CROSS-REFERENCE TO RELATED APPLICATIONS

This application claims priority to U.S. Provisional Application No. 62/599,691, filed Dec. 16, 2017, the entire disclosure of which is hereby incorporated by reference herein.

FIELD

Embodiments of the disclosure relate to methods of selectively depositing ruthenium films. More particularly, embodiments of the disclosure are directed to methods of depositing ruthenium on conductive materials over insulating materials, depositing ruthenium on insulating materials over conductive materials and methods of controlling process selectivity.

BACKGROUND

The semiconductor industry continues to strive for continuous device miniaturization that is driven by the need for mobile, and high-performance systems in emerging industries such as autonomous vehicles, virtual reality, and future mobile devices. To accomplish this feat, new, high-performance materials are needed to circumvent inherent engineering and physics issues encountered in rapid reduction of features in microelectronic devices.

Ruthenium is a new proposed material for integration owing to its high melting point (ability to withstand high current densities), exceptional density, and ability to conduct electrical current. Ruthenium and ruthenium containing thin films have attractive material and conductive properties. Ruthenium films have been proposed for applications from front end to back end parts of semiconductor and microelectronic devices.

Thin-films of ruthenium would ideally be deposited using thin-film deposition techniques such as Chemical Vapor Deposition (CVD) and Atomic Layer Deposition (ALD) owing to their inherent ability to deposit material in a high-throughput, conformal, and precise fashion.

As the design of semiconductor devices evolve, precision material manufacturing in the semiconductor industry has entered an era of atomic scale dimensions. At the atomic scale, with only tens of atoms at stake, there is no margin for error, i.e., every atom matters. This unprecedented challenge demands new material processing techniques which have atomic level precisions. However, increasing complexity of the process flow required in atomic scale device manufacturing can significantly increase the cost of manufacturing.

Selective deposition technologies offer the potential for chemically-selective atomic-layer precision in semiconductor film patterning. Selective deposition also offers the potential for simpler process flows by eliminating lithography or other processes.

Selective deposition of materials can be accomplished in a variety of ways. For instance, some processes may have inherent selectivity to surfaces based on their surface chemistry. These processes are fairly rare and usually need to have surfaces with drastically different surface energies, such as metals and dielectrics.

Therefore there is a need for methods of selectively depositing ruthenium films on a variety of substrate materials.

SUMMARY

One or more embodiments of the disclosure are directed to a selective deposition method comprising providing a substrate comprising a conductive material having a first surface and an insulating material having a second surface. The substrate is exposed to a ruthenium precursor. The substrate is exposed to a reactant. The reactant comprises one or more of $O_2$, $H_2$ or $H_2O$. Ruthenium selectively deposits on either the first surface over the second surface or the second surface over the first surface.

Additional embodiments of the disclosure are directed to a selective deposition method comprising providing a substrate comprising a conductive material having a first surface and an insulating material having a second surface. The conductive material comprises one or more of Cu, Co, W, Ta, Ti or oxides or nitrides thereof. The insulating material comprises one or more of $SiO_2$, SiN or high resistance Si. The substrate is exposed to a ruthenium precursor. The substrate is exposed to a reactant. The reactant comprises one or more of $O_2$, $H_2$ or $H_2O$. The substrate is maintained at a temperature greater than or equal to about 250° C. and ruthenium selectively deposits on the first surface over the second surface.

Further embodiments of the disclosure are directed to a selective deposition method comprising providing a substrate comprising a conductive material having a first surface and an insulating material having a second surface. The conductive material comprises one or more of Cu, Co, W, Ta, Ti or oxides or nitrides thereof. The insulating material comprises one or more of $SiO_2$, SiN or high resistance Si. The substrate is exposed to a ruthenium precursor. The substrate is exposed to a reactant. The reactant comprises one or more of $O_2$, $H_2$ or $H_2O$. The substrate is maintained at a temperature less than or equal to about 200° C. and ruthenium selectively deposits on the second surface over the first surface.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

Figure 1:
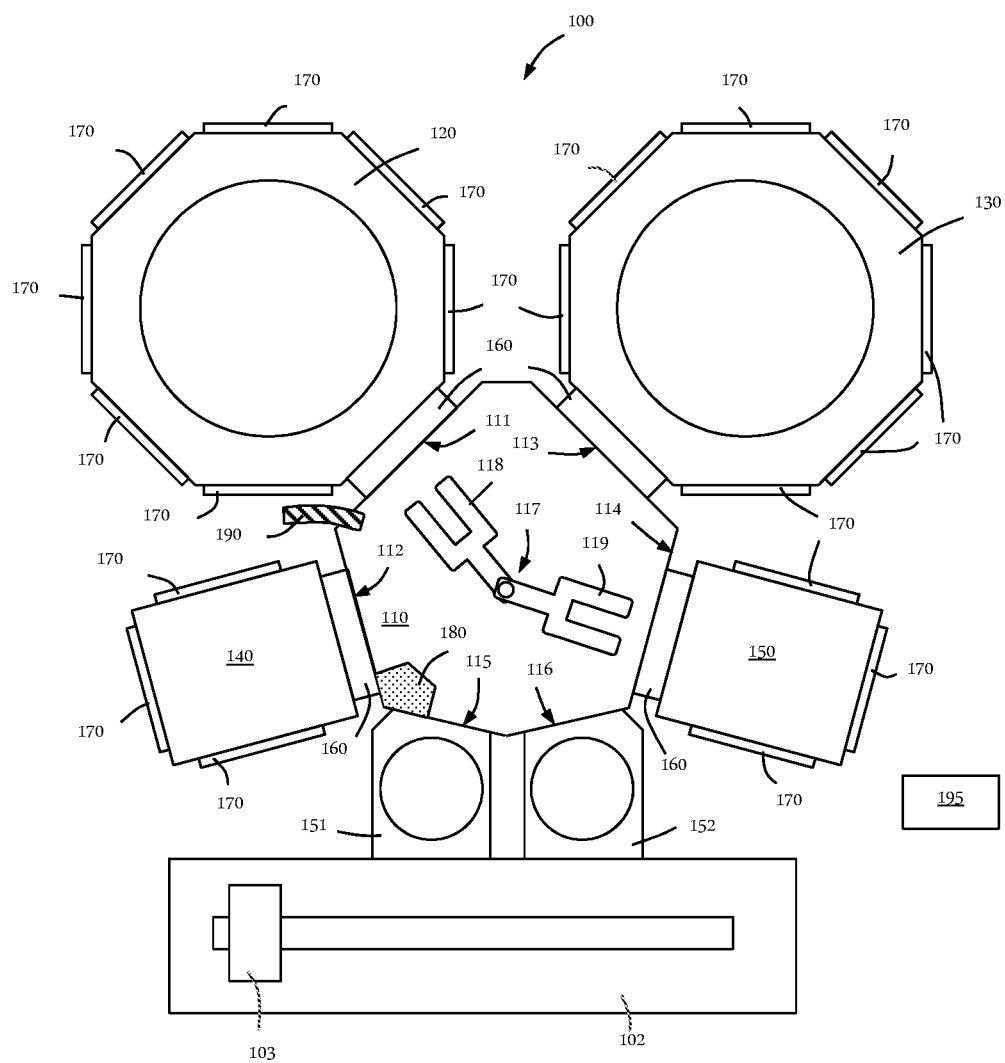
FIG. 1 shows a schematic view of a processing platform in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process routines set forth in the following description. The disclosure is capable of other embodiments and of being practiced or being carried out in various ways.

Embodiments of the disclosure provide methods for selectively depositing ruthenium containing films. The methods of various embodiments use atomic layer deposition (ALD) to provide ruthenium films on select substrate surfaces.

In some embodiments, the substrate comprises a conductive material and an insulating material. The surface of the conductive material is referred to as the first surface. The surface of the insulating material is referred to as the second surface.

In some embodiments, the conductive material comprises a metal, a metal, a metal nitride, a metal oxide or a combination thereof. In some embodiments, the conductive material comprises or consists essentially of one or more of Cu, Co, W, Ta, Ti or oxides, nitrides or oxynitrides thereof. As used in this specification and the appended claims, the term "consists essentially of" means that greater than or equal to about 95%, 98% or 99% of the specified material is the stated material.

The insulating material can be any suitable dielectric that shows selectivity to the conductive material. The insulating material can be a high-k (k>5) or low-k (k<5) dielectric. In some embodiments, the insulating material comprises silicon. In some embodiments, the insulating material comprises or consists essentially of one or more of $SiO_2$, SiN or high resistance Si. As used in this regard, "high resistance Si" means a silicon material with higher resistance than a pure silicon material. In some embodiments, the high resistance Si material has a layer of oxidation on the surface. Accordingly, in some embodiments, high resistance silicon is silicon with a thin layer of SiOx on the surface.

In some embodiments, the conductive material consists essentially of W and the insulating material consists essentially of $SiO_2$. In some embodiments, the conductive material consists essentially of TiN and the insulating material consists essentially of SiN.

Embodiments of the disclosure provide methods of selectively depositing ruthenium containing films on one surface over another surface. As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface. The term "over" used in this regard does not imply a physical orientation of one surface on top of another surface, rather a relationship of the thermodynamic or kinetic properties of the chemical reaction with one surface relative to the other surface. For example, selectively depositing a ruthenium film onto a conductive material surface over an insulating material surface means that the ruthenium film deposits on the conductive material surface and less or no ruthenium film deposits on the insulating material surface; or that the formation of a ruthenium film on the conductive material surface is thermodynamically or kinetically favorable relative to the formation of a ruthenium film on the insulating material surface.

In a selective deposition process, a film or layer will be deposited on one portion of the substrate surface more favorably than a different substrate portion. The selectivity of a deposition process is generally expressed as a multiple of growth rate. For example, if one surface is grown (or deposited on) 25 times faster than a different surface, the process would be described as having a selectivity of 25:1. In this regard, higher ratios indicate more selective processes.

Some embodiments of the disclosure advantageously provide methods for selective deposition which favor a conductive material surface over (relative to) an insulating material surface. Some embodiments of the disclosure advantageously provide for selective deposition which favors an insulating material surface over a conductive material surface. Surprisingly, the inventors have found that the selectivity of some embodiments can be controlled by controlling the substrate temperature.

In some embodiments, the substrate is maintained at a temperature greater than or equal to about 250° C. and ruthenium selectively deposits on the first surface over the second surface. In some embodiments, the substrate is maintained at a temperature less than or equal to about 200° C. and ruthenium selectively deposits on the second surface over the first surface. In some embodiments, the selectivity is greater than about 5:1. Without being bound by theory, it is believed that the selectivity is not continuous, but rather "flips" between 200° C. and 250° C.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing routines disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., hydrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Some embodiments of the disclosure utilize a spatial ALD process which is performed on a processing platform as disclosed herein. Referring to the Figures, FIG. 1 shows a processing platform 100 in accordance with one or more embodiment of the disclosure. The embodiment shown in FIG. 1 is merely representative of one possible configuration and should not be taken as limiting the scope of the disclosure. For example, in some embodiments, the processing platform 100 has different numbers of process chambers, buffer chambers and robot configurations.

The processing platform 100 includes a central transfer station 110 which has a plurality of sides 111, 112, 113, 114, 115, 116. The central transfer station 110 shown has a first side 111, a second side 112, a third side 113, a fourth side 114, a fifth side 115 and a sixth side 116. Although six sides are shown, those skilled in the art will understand that there can be any suitable number of sides to the central transfer station 110 depending on, for example, the overall configuration of the processing platform 100.

The transfer station 110 has a robot 117 positioned therein. The robot 117 can be any suitable robot capable of moving a wafer during processing. In some embodiments, the robot 117 has a first arm 118 and a second arm 119. The first arm 118 and second arm 119 can be moved independently of the other arm. The first arm 118 and second arm 119 can move in the x-y plane and/or along the z-axis. In some embodiments, the robot 117 includes a third arm or a fourth arm (not shown). Each of the arms can move independently of other arms.

A first batch processing chamber 120 can be connected to a first side 111 of the central transfer station 110. The first batch processing chamber 120 can be configured to process x wafers at a time for a batch time. In some embodiments, the first batch processing chamber 120 can be configured to process in the range of about four (x=4) to about 12 (x=12) wafers at the same time. In some embodiments, the first batch processing chamber 120 is configured to process six (x=6) wafers at the same time. As will be understood by the skilled artisan, while the first batch processing chamber 120 can process multiple wafers between loading/unloading of an individual wafer, each wafer may be subjected to different process conditions at any given time. For example, a spatial atomic layer deposition chamber, like that shown in FIGS. 2 through 6, expose the wafers to different process conditions in different processing regions so that as a wafer is moved through each of the regions, the process is completed.

Figure 2:
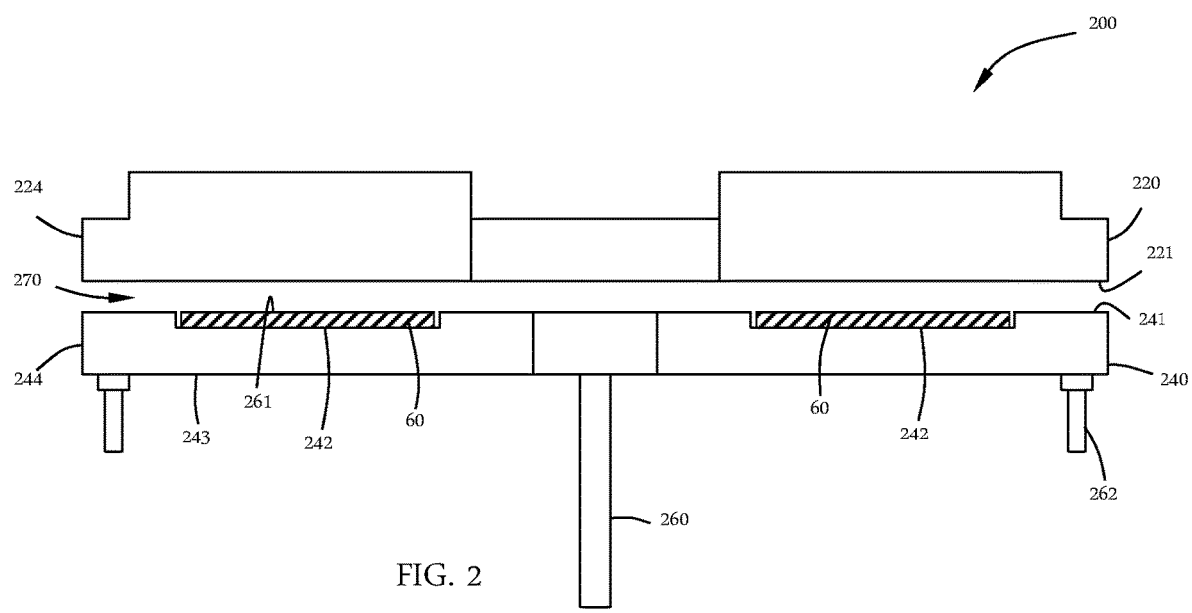
FIG. 2 shows a cross-sectional view of a batch processing chamber in accordance with one or more embodiment of the disclosure.

FIG. 2 shows a cross-section of a processing chamber 200 including a gas distribution assembly 220, also referred to as injectors or an injector assembly, and a susceptor assembly 240. The gas distribution assembly 220 is any type of gas delivery device used in a processing chamber. The gas distribution assembly 220 includes a front surface 221 which faces the susceptor assembly 240. The front surface 221 can have any number or variety of openings to deliver a flow of gases toward the susceptor assembly 240. The gas distribution assembly 220 also includes an outer edge 224 which in the embodiments shown, is substantially round.

The specific type of gas distribution assembly 220 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 3:
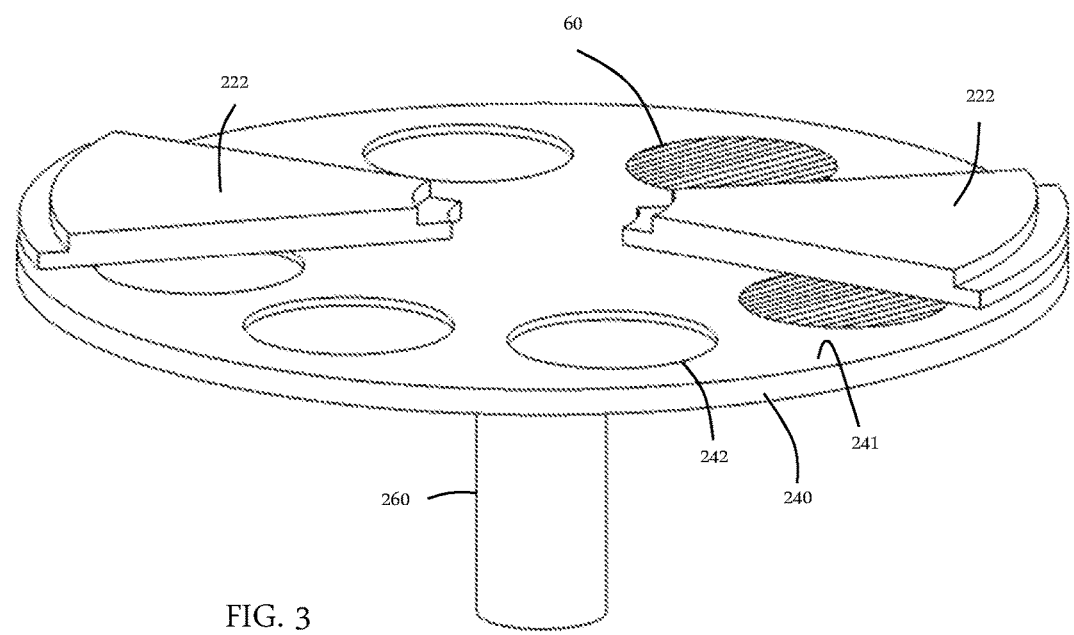
FIG. 3 shows a partial perspective view of a batch processing chamber in accordance with one or more embodiment of the disclosure.

In some embodiments, the gas distribution assembly 220 is a rigid stationary body made of a single injector unit. In one or more embodiments, the gas distribution assembly 220 is made up of a plurality of individual sectors (e.g., injector units 222), as shown in FIG. 3. Either a single piece body or a multi-sector body can be used with the various embodiments of the disclosure described.

A susceptor assembly 240 is positioned beneath the gas distribution assembly 220. The susceptor assembly 240 includes a top surface 241 and at least one recess 242 in the top surface 241. The susceptor assembly 240 also has a bottom surface 243 and an edge 244. The recess 242 can be any suitable shape and size depending on the shape and size of the substrates 60 being processed. In the embodiment shown in FIG. 2, the recess 242 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 2, the recess 242 in the top surface 241 of the susceptor assembly 240 is sized so that a substrate 60 supported in the recess 242 has a top surface 61 substantially coplanar with the top surface 241 of the susceptor 240. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 240 of FIG. 2 includes a support post 260 which is capable of lifting, lowering and rotating the susceptor assembly 240. The susceptor assembly may include a heater, or gas lines, or electrical components within the center of the support post 260. The support post 260 may be the primary means of increasing or decreasing the gap between the susceptor assembly 240 and the gas distribution assembly 220, moving the susceptor assembly 240 into proper position. The susceptor assembly 240 may also include fine tuning actuators 262 which can make micro-adjustments to susceptor assembly 240 to create a predetermined gap 270 between the susceptor assembly 240 and the gas distribution assembly 220.

In some embodiments, the gap 270 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 200 shown in the Figures is a carousel-type chamber in which the susceptor assembly 240 can hold a plurality of substrates 60. As shown in FIG. 3, the gas distribution assembly 220 may include a plurality of separate injector units 222, each injector unit 222 being capable of depositing a film on the wafer, as the wafer is moved beneath the injector unit. Two pie-shaped injector units 222 are shown positioned on approximately opposite sides of and above the susceptor assembly 240. This number of injector units 222 is shown for illustrative purposes only. It will be understood that more or less injector units 222 can be included. In some embodiments, there are a sufficient number of pie-shaped injector units 222 to form a shape conforming to the shape of the susceptor assembly 240. In some embodiments, each of the individual pie-shaped injector units 222 may be independently moved, removed and/or replaced without affecting any of the other injector units 222. For example, one segment may be raised to permit a robot to access the region between the susceptor assembly 240 and gas distribution assembly 220 to load/unload substrates 60.

Figure 4:
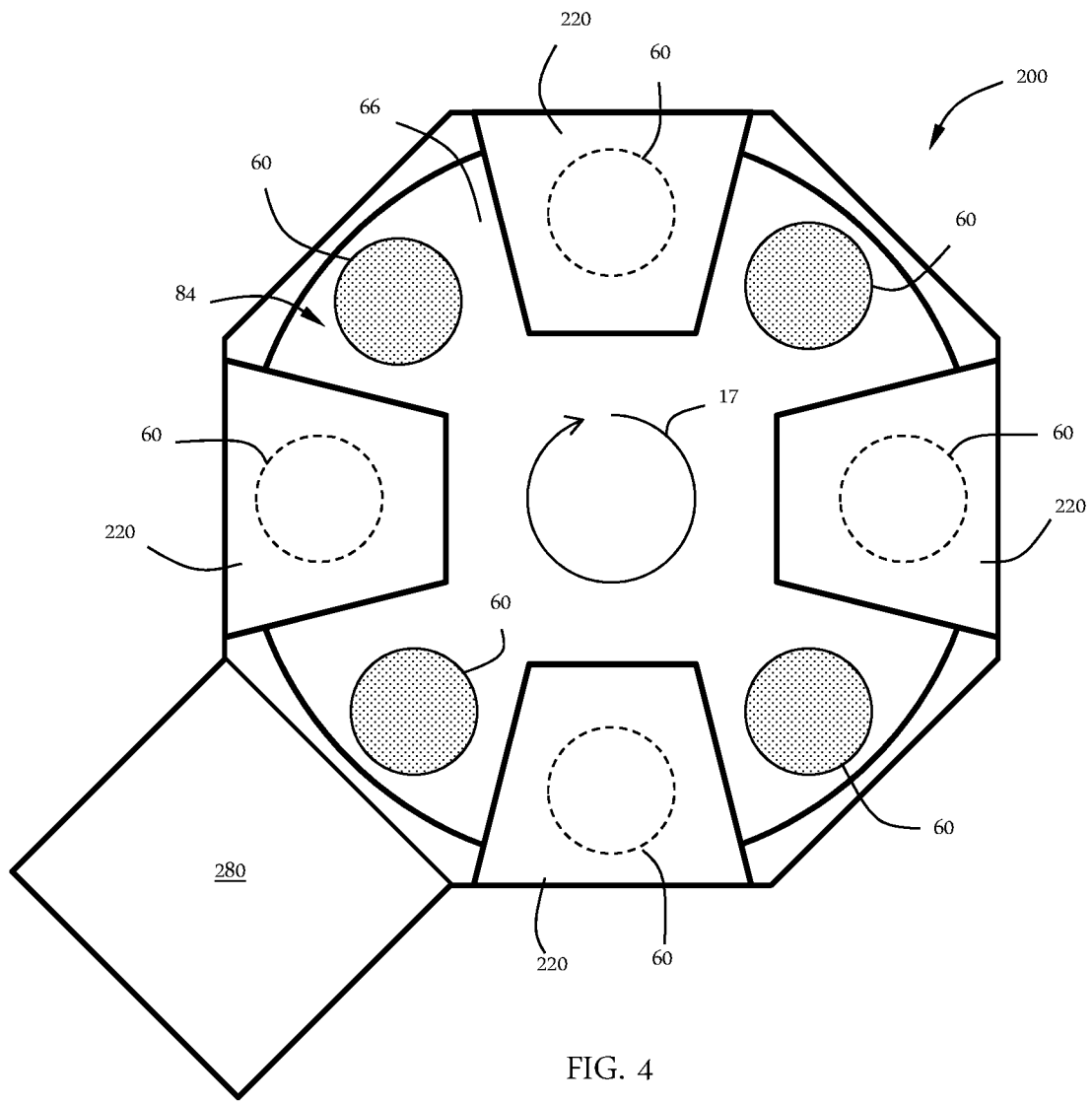
FIG. 4 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 4, the processing chamber 200 has four gas injector assemblies and four substrates 60. At the outset of processing, the substrates 60 can be positioned between the gas distribution assemblies 220. Rotating 17 the susceptor assembly 240 by 45° will result in each substrate 60 which is between gas distribution assemblies 220 to be moved to a gas distribution assembly 220 for film deposition, as illustrated by the dotted circle under the gas distribution assemblies 220. An additional 45° rotation would move the substrates 60 away from the gas distribution assemblies 220. The number of substrates 60 and gas distribution assemblies 220 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 220 includes eight process regions separated by gas curtains and the susceptor assembly 240 can hold six wafers.

The processing chamber 200 shown in FIG. 4 is merely representative of one possible configuration and should not be taken as limiting the scope of the disclosure. Here, the processing chamber 200 includes a plurality of gas distribution assemblies 220. In the embodiment shown, there are four gas distribution assemblies 220 (also called injector assemblies) evenly spaced about the processing chamber 200. The processing chamber 200 shown is octagonal; however, those skilled in the art will understand that this is one possible shape and should not be taken as limiting the scope of the disclosure. The gas distribution assemblies 220 shown are trapezoidal, but can be a single circular component or made up of a plurality of pie-shaped segments, like that shown in FIG. 3.

The embodiment shown in FIG. 4 includes a load lock chamber 280, or an auxiliary chamber like a buffer station.

This chamber 280 is connected to a side of the processing chamber 200 to allow, for example the substrates (also referred to as substrates 60) to be loaded/unloaded from the processing chamber 200. A wafer robot may be positioned in the chamber 280 to move the substrate onto the susceptor.

Rotation of the carousel (e.g., the susceptor assembly 240) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing routines between each layer deposition (e.g., exposure to plasma).

Figure 5:
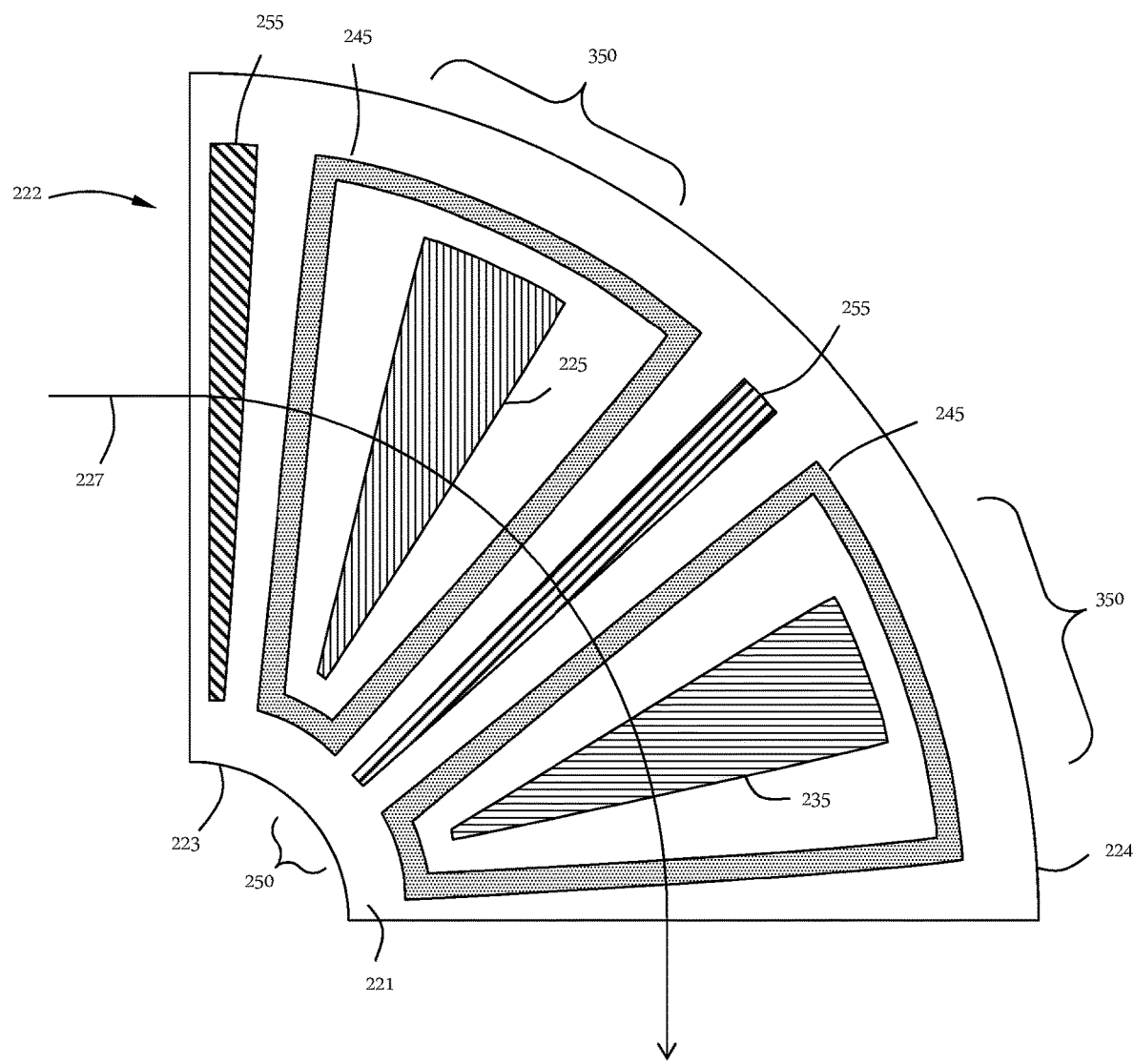
FIG. 5 shows a schematic view of a portion of a wedge shaped gas distribution assembly for use in a batch processing chamber in accordance with one or more embodiment of the disclosure.
Figure 6:
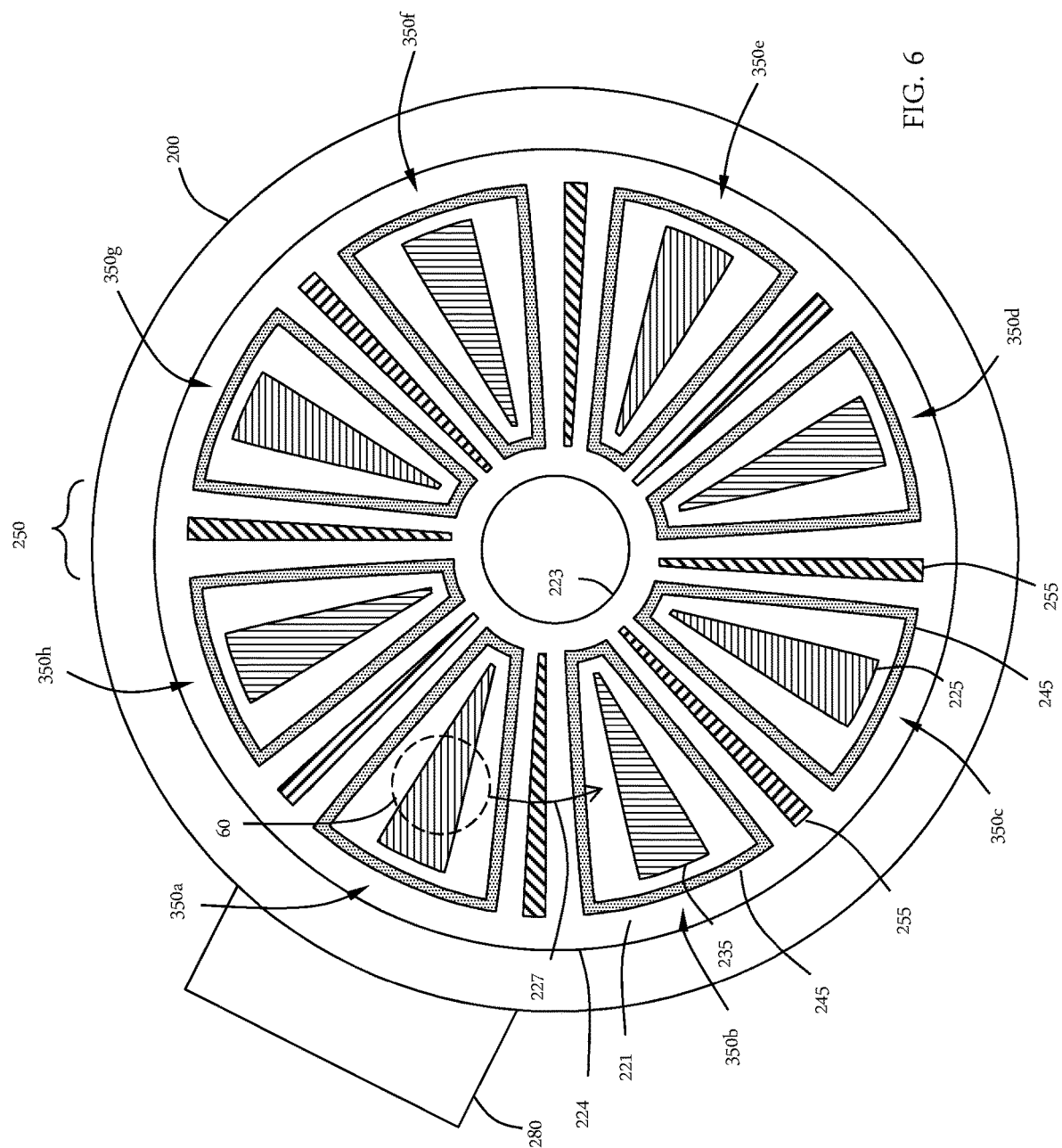
FIG. 6 shows a schematic view of a batch processing chamber in accordance with one or more embodiment of the disclosure.

FIG. 5 shows a sector or portion of a gas distribution assembly 220, which may be referred to as an injector unit. The injector units 222 can be used individually or in combination with other injector units. For example, as shown in FIG. 6, four of the injector units 222 of FIG. 5 are combined to form a single gas distribution assembly 220. (The lines separating the four injector units are not shown for clarity.) While the injector unit 222 of FIG. 5 has both a first reactive gas port 225 and a second gas port 235 in addition to purge gas ports 255 and vacuum ports 245, an injector unit 222 does not need all of these components.

Referring to both FIGS. 5 and 6, a gas distribution assembly 220 in accordance with one or more embodiment may comprise a plurality of sectors (or injector units 222) with each sector being identical or different. The gas distribution assembly 220 is positioned within the processing chamber and comprises a plurality of elongate gas ports 225, 235, 245 in a front surface 221 of the gas distribution assembly 220. The plurality of elongate gas ports 225, 235, 245, 255 extend from an area adjacent the inner peripheral edge 223 toward an area adjacent the outer peripheral edge 224 of the gas distribution assembly 220. The plurality of gas ports shown include a first reactive gas port 225, a second gas port 235, a vacuum port 245 which surrounds each of the first reactive gas ports and the second reactive gas ports and a purge gas port 255.

With reference to the embodiments shown in FIG. 5 or 6, when stating that the ports extend from at least about an inner peripheral region to at least about an outer peripheral region, however, the ports can extend more than just radially from inner to outer regions. The ports can extend tangentially as vacuum port 245 surrounds reactive gas port 225 and reactive gas port 235. In the embodiment shown in FIGS. 5 and 6, the wedge shaped reactive gas ports 225, 235 are surrounded on all edges, including adjacent the inner peripheral region and outer peripheral region, by a vacuum port 245.

Referring to FIG. 5, as a substrate moves along path 227, each portion of the substrate surface is exposed to the various reactive gases. To follow the path 227, the substrate will be exposed to, or "see", a purge gas port 255, a vacuum port 245, a first reactive gas port 225, a vacuum port 245, a purge gas port 255, a vacuum port 245, a second gas port 235 and a vacuum port 245. Thus, at the end of the path 227 shown in FIG. 5, the substrate has been exposed to the first reactive gas and the second reactive gas to form a layer. The injector unit 222 shown makes a quarter circle but could be larger or smaller. The gas distribution assembly 220 shown in FIG. 6 can be considered a combination of four of the injector units 222 of FIG. 3 connected in series.

The injector unit 222 of FIG. 5 shows a gas curtain 250 that separates the reactive gases. The term "gas curtain" is used to describe any combination of gas flows or vacuum that separate reactive gases from mixing. The gas curtain 250 shown in FIG. 5 comprises the portion of the vacuum port 245 next to the first reactive gas port 225, the purge gas port 255 in the middle and a portion of the vacuum port 245 next to the second gas port 235. This combination of gas flow and vacuum can be used to prevent or minimize gas phase reactions of the first reactive gas and the second reactive gas.

Referring to FIG. 6, the combination of gas flows and vacuum from the gas distribution assembly 220 form a separation into a plurality of process regions 350. The process regions are roughly defined around the individual gas ports 225, 235 with the gas curtain 250 between 350. The embodiment shown in FIG. 6 makes up eight separate process regions 350 with eight separate gas curtains 250 between. A processing chamber can have at least two process regions. In some embodiments, there are at least three, four, five, six, seven, eight, nine, 10, 11 or 12 process regions.

During processing a substrate may be exposed to more than one process region 350 at any given time. However, the portions that are exposed to the different process regions will have a gas curtain separating the two. For example, if the leading edge of a substrate enters a process region including the second gas port 235, a middle portion of the substrate will be under a gas curtain 250 and the trailing edge of the substrate will be in a process region including the first reactive gas port 225.

A factory interface (as shown in FIG. 4), which can be, for example, a load lock chamber 280, is shown connected to the processing chamber 200. A substrate 60 is shown superimposed over the gas distribution assembly 220 to provide a frame of reference. The substrate 60 may often sit on a susceptor assembly to be held near the front surface 221 of the gas distribution assembly 220. The substrate 60 is loaded via the factory interface into the processing chamber 200 onto a substrate support or susceptor assembly (see FIG. 4). The substrate 60 can be shown positioned within a process region because the substrate is located adjacent the first reactive gas port 225 and between two gas curtains 250a, 250b. Rotating the substrate 60 along path 227 will move the substrate counter-clockwise around the processing chamber 200. Thus, the substrate 60 will be exposed to the first process region 350a through the eighth process region 350h, including all process regions between.

Some embodiments of the disclosure are directed to a processing chamber 200 with a plurality of process regions 350a-350h with each process region separated from an adjacent region by a gas curtain 250. For example, the processing chamber shown in FIG. 6. The number of gas curtains and process regions within the processing chamber can be any suitable number depending on the arrangement of gas flows. The embodiment shown in FIG. 6 has eight gas curtains 250 and eight process regions 350a-350h.

Referring back to FIG. 1, the processing platform 100 includes a treatment chamber 140 connected to a second side 112 of the central transfer station 110. The treatment chamber 140 of some embodiments is configured to expose the wafers to a process to treat the wafers before and/or after processing in first batch processing chamber 120. The treatment chamber 140 of some embodiments comprises an annealing chamber. The annealing chamber can be a furnace annealing chamber or a rapid thermal annealing chamber, or a different chamber configured to hold a wafer at a predetermined temperature and pressure and provide a flow of gas to the chamber.

In some embodiments, the processing platform further comprises a second batch processing chamber 130 connected to a third side 113 of the central transfer station 110. The second batch processing chamber 130 can be configured similarly to the first batch processing chamber 120, or can be configured to perform a different process or to process different numbers of substrates.

The second batch processing chamber 130 can be the same as the first batch processing chamber 120 or different. In some embodiments, the first batch processing chamber 120 and the second batch processing chamber 130 are configured to perform the same process with the same number of wafers in the same batch time so that x (the number of wafers in the first batch processing chamber 120) and y (the number of wafers in the second batch processing chamber 130) are the same and the first batch time and second batch time (of the second batch processing chamber 130) are the same. In some embodiments, the first batch processing chamber 120 and the second batch processing chamber 130 are configured to have one or more of different numbers of wafers (x not equal to y), different batch times, or both.

In the embodiment shown in FIG. 1, the processing platform 100 includes a second treatment chamber 150 connected to a fourth side 114 of the central transfer station 110. The second treatment chamber 150 can be the same as the treatment chamber 140 or different.

The processing platform 100 can include a controller 195 connected to the robot 117 (the connection is not shown). The controller 195 can be configured to move wafers between the treatment chamber 140 and the first batch processing chamber 120 with a first arm 118 of the robot 117. In some embodiments, the controller 195 is also configured to move wafers between the second treatment chamber 150 and the second batch processing chamber 130 with a second arm 119 of the robot 117.

In some embodiments, the controller 195 is connected to the susceptor assembly 240 and the gas distribution assembly 220 of a processing chamber 200. The controller 195 can be configured to rotate 17 the susceptor assembly 240 about a central axis. The controller can also be configured to control the gas flows in the gas ports 225, 235, 245, 255. In some embodiments, the first reactive gas port 225 provides a flow of a ruthenium precursor. In some embodiments, the second reactive gas port 235 provides a flow of a reactant. In some embodiments, other gas ports (not labelled) may provide a flow of a plasma. The first reactive gas port 225, the second reactive gas port 235 and the other reactive gas ports (not labelled) may be arranged in any processing order.

The processing platform 100 can also include a first buffer station 151 connected to a fifth side 115 of the central transfer station 110 and/or a second buffer station 152 connected to a sixth side 116 of the central transfer station 110. The first buffer station 151 and second buffer station 152 can perform the same or different functions. For example, the buffer stations may hold a cassette of wafers which are processed and returned to the original cassette, or the first buffer station 151 may hold unprocessed wafers which are moved to the second buffer station 152 after processing. In some embodiments, one or more of the buffer stations are configured to pre-treat, pre-heat or clean the wafers before and/or after processing.

In some embodiments, the controller 195 is configured to move wafers between the first buffer station 151 and one or more of the treatment chamber 140 and the first batch processing chamber 120 using the first arm 118 of the robot 117. In some embodiments, the controller 195 is configured to move wafers between the second buffer station 152 and one or more of the second treatment chamber 150 or the second batch processing chamber 130 using the second arm 119 of the robot 117.

The processing platform 100 may also include one or more slit valves 160 between the central transfer station 110 and any of the processing chambers. In the embodiment shown, there is a slit valve 160 between each of the processing chambers 120, 130, 140, 150 and the central transfer station 110. The slit valves 160 can open and close to isolate the environment within the processing chamber from the environment within the central transfer station 110. For example, if the processing chamber will generate plasma during processing, it may be helpful to close the slit valve for that processing chamber to prevent stray plasma from damaging the robot in the transfer station.

In some embodiments, the processing chambers are not readily removable from the central transfer station 110. To allow maintenance to be performed on any of the processing chambers, each of the processing chambers may further include a plurality of access doors 170 on sides of the processing chambers. The access doors 170 allow manual access to the processing chamber without removing the processing chamber from the central transfer station 110. In the embodiment shown, each side of each of the processing chamber, except the side connected to the transfer station, have an access door 170. The inclusion of so many access doors 170 can complicate the construction of the processing chambers employed because the hardware within the chambers would need to be configured to be accessible through the doors.

The processing platform of some embodiments includes a water box 180 connected to the central transfer station 110. The water box 180 can be configured to provide a coolant to any or all of the processing chambers. Although referred to as a "water" box, those skilled in the art will understand that any coolant can be used.

In some embodiments, the size of the processing platform 100 allows for the connection to house power through a single power connector 190. The single power connector 190 attaches to the processing platform 100 to provide power to each of the processing chambers and the central transfer station 110.

The processing platform 100 can be connected to a factory interface 102 to allow wafers or cassettes of wafers to be loaded into the processing platform 100. A robot 103 within the factory interface 102 can be moved the wafers or cassettes into and out of the buffer stations 151, 152. The wafers or cassettes can be moved within the processing platform 100 by the robot 117 in the central transfer station 110. In some embodiments, the factory interface 102 is a transfer station of another cluster tool.

In some embodiments, the processing platform 100 or first batch processing chamber 120 is connected to a controller. The controller can be the same controller 195 or a different controller. The controller can be coupled to the susceptor assembly and the gas distribution assembly of the first batch processing chamber 120 and has one or more configurations. The configurations can include, but are not limited to, a first configuration to rotate the susceptor assembly about the central axis, a second configuration to provide a flow of a ruthenium precursor to a process region, a third configuration to provide a flow of a reactant to a process region, a fourth configuration to provide a plasma in a process region.

Figure 7:
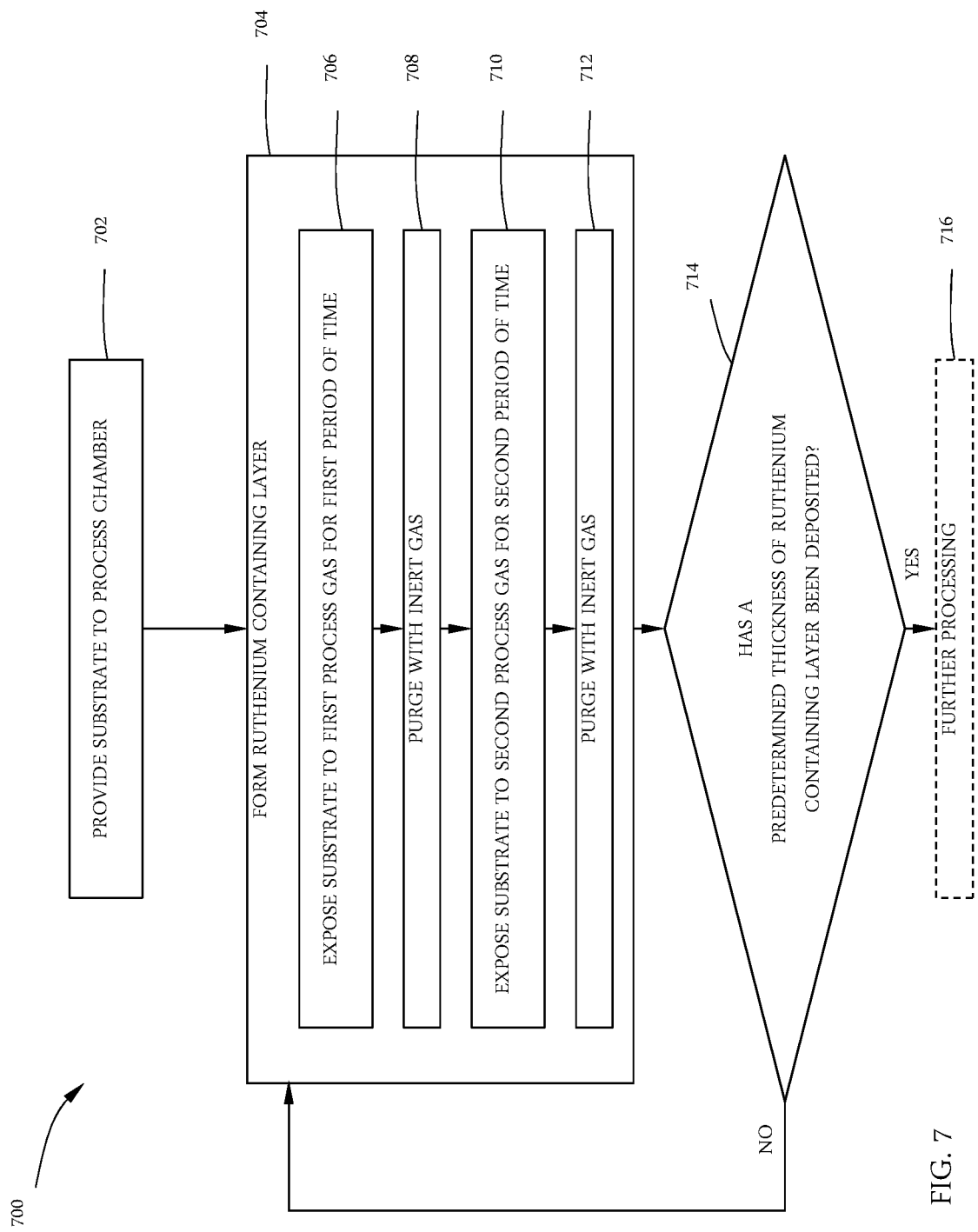
FIG. 7 illustrates an exemplary process sequence for the formation of a ruthenium layer using a two pulse cyclical deposition technique according to one or more embodiment of the disclosure.

FIG. 7 depicts a method for forming a ruthenium containing layer on a substrate in accordance with one or more embodiment of the disclosure. The method 700 generally begins at 702, where a substrate upon which a ruthenium containing layer is to be formed is provided and placed into a processing chamber. As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the ruthenium containing layer, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the ruthenium containing layer may be, at least partially, formed thereon. For example, in some embodiments, a layer comprising a metal, a nitride, an oxide, or the like, or combinations thereof may be disposed on the substrate and may have the ruthenium containing layer formed upon such layer or layers.

At 704, a ruthenium containing layer is formed on the substrate. The ruthenium containing layer may be formed via a cyclical deposition process, such as atomic layer deposition (ALD), or the like. In some embodiments, the forming of a ruthenium containing layer via a cyclical deposition process may generally comprise exposing the substrate to two or more process gases separately. In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In some embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any embodiment of a time-domain ALD or spatial ALD process, the sequence may be repeated until a predetermined layer thickness is formed on the substrate surface.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The process of forming the ruthenium containing layer at 704 may begin by exposing the substrate to a first reactive gas. In some embodiments, the first reactive gas comprises a ruthenium precursor (also referred to as a ruthenium containing gas, and the like) and is exposed to the substrate for a first period of time, as shown at 706.

The ruthenium precursor may be any suitable precursor to adsorb a layer of ruthenium on the substrate for later reaction. In some embodiments, the ruthenium precursor comprises a ruthenium metal center and one or more ligands. In some embodiments, the ruthenium metal center comprises one or more ruthenium atoms. Stated differently, in some embodiments, the ruthenium precursor is one or more of a dimer, trimer or tetramer.

The number of ligands and types of ligands on the ruthenium precursor can vary, based on, for example, the oxidation state of the ruthenium atom. The ruthenium precursor can be homoleptic or heteroleptic. In some embodiments, the ruthenium precursor is a homoleptic complex (i.e., where the ligands of the ruthenium precursor are the same). In some embodiments, the ruthenium precursor is heteroleptic (i.e., at least one of the ligands is different than the other ligand). In some embodiments, the ruthenium precursor comprises triruthenium dodecacarbonyl ($Ru_3(CO)_{12}$). In some embodiments, the ruthenium precursor comprises at least one cyclopentadienyl ligand (Cp) or a derivative thereof. Suitable derivatives of cyclopentadienyl ligands include, without limitation, Cp substituted with one or more alkyl group or amino group and Cp which are covalently linked to another Cp or a different ligand. In some embodiments, the ruthenium precursor comprises bis(cyclopentadienyl)ruthenium(II) ($Ru(Cp)_2$). In some embodiments, the ruthenium precursor comprises or consists essentially of bis(ethylcyclopentadienyl)ruthenium(II) ($Ru(EtCp)_2$). In some embodiments, the ruthenium precursor comprises or consists essentially of bis(pentamethylcyclopentadienyl)ruthenium(II) ($Ru(Me_5Cp)_2$ or $Ru(Cp^*)_2$).

The ruthenium precursor is delivered to the processing chamber as a ruthenium containing gas. The ruthenium containing gas may be provided in one or more pulses or continuously. The flow rate of the ruthenium containing gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The ruthenium containing gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to the ruthenium containing gas may be any suitable amount of time necessary to allow the ruthenium precursor to form an adequate nucleation layer atop the substrate surface(s). For example, the process gas may be flowed into the process chamber for a period of about 0.1 seconds to about 90 seconds. In some time-domain ALD processes, the ruthenium containing gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as the ruthenium containing gas. The inert gas may be mixed with the ruthenium containing gas (e.g., as a diluent gas) or be provided separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, nitrogen or combinations thereof. In one or more embodiments, the ruthenium containing gas is mixed with argon prior to flowing into the process chamber.

The temperature of the substrate during deposition can be controlled, for example, by setting the temperature of the substrate support or susceptor. In some embodiments the substrate is held at a temperature in the range of about 0° C. to about 600° C., or in the range of about 25° C. to about 500° C., or in the range of about 50° C. to about 450° C., or in the range of about 100° C. to about 400° C., or in the range of about 100° C. to about 200° C., or in the range of about 250° C. to about 350° C.

In one or more embodiments, the substrate temperature is controlled to adjust the selectivity of the deposition process. In some embodiments, the substrate is maintained at a temperature less than or equal to about 200° C., or less than or equal to about 150° C., or less than about 100° C. and ruthenium is deposited on the insulating material over the conductive material. In some embodiments, the substrate is maintained at a temperature greater than or equal to about 250° C., or greater than or equal to about 300° C., or greater than about 350° C. and ruthenium is deposited on the conductive material over the insulating material.

In addition to the foregoing, additional process parameters may be regulated while exposing the substrate to the ruthenium containing gas. For example, in some embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr.

Next, at 708, the process chamber (especially in time-domain ALD) may be purged using an inert gas. (This may not be needed in spatial ALD processes as there are gas curtains separating the reactive gases.) The inert gas may be any inert gas, for example, such as argon, helium, neon, nitrogen or the like. In some embodiments, the inert gas may be the same, or alternatively, may be different from the inert gas provided to the process chamber during the exposure of the substrate to the ruthenium containing gas 706. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the first process gas, described above, or in some embodiments, the flow rate may be increased or decreased. For example, in some embodiments, the inert gas may be provided to the process chamber at a flow rate of about 0 to about 10000 sccm to purge the process chamber. In spatial ALD, purge gas curtains are maintained between the flows of reactive gases and purging the process chamber may not be necessary. In some embodiments of a spatial ALD process, the process chamber or region of the process chamber may be purged with an inert gas.

The flow of inert gas may facilitate removing any excess first process gas components and/or excess reaction byproducts from the process chamber to prevent unwanted gas phase reactions of the first and second process gases. For example, the flow of inert gas may remove excess ruthenium containing gas from the process chamber, preventing a reaction between the ruthenium precursor and a subsequent reactive gas.

Next, at 710, the substrate is exposed to a second process gas for a second period of time. The second process gas reacts with the ruthenium containing compound on the substrate surface to create a deposited film. In some embodiments, the second reactive gas is referred to as the reactant. The second process gas can impact the resulting ruthenium film. For example, when the second process gas is $H_2$, a ruthenium film may be deposited, but when the second reactive gas is silane or disilane, a ruthenium silicide film may be deposited.

In some embodiments, the second reactive gas comprises one or more of $O_2$, $H_2$, $H_2O$ or plasmas thereof. In some embodiments, the second reactive gas is selected to deposit a metal film (e.g., a ruthenium film) or a metal oxide (e.g., $Ru_xO_y$) on the substrate.

In some embodiments, the second reactive gas comprises hydrogen and the resulting film formed is a ruthenium film. The hydrogen gas may be supplied to the substrate surface at a flow rate greater than the ruthenium containing gas. In one or more embodiments, the flow rate of $H_2$ is greater than about 1 time that of the ruthenium containing gas, or about 100 times that of the ruthenium containing gas, or in the range of about 3000 to 5000 times that of the ruthenium containing gas. The hydrogen gas can be supplied, in time-domain ALD, for a time in the range of about 1 sec to about 30 sec, or in the range of about 5 sec to about 20 sec, or in the range of about 10 sec to about 15 sec. The hydrogen gas can be supplied at a pressure in the range of about 1 Torr to about 30 Torr, or in the range of about 5 Torr to about 25 Torr, or in the range of about 10 Torr to about 20 Torr, or up to about 50 Torr. The substrate temperature can be maintained at any suitable temperature as disclosed elsewhere herein. In one or more embodiments, the substrate is maintained at a temperature about the same as that of the substrate during the ruthenium containing gas exposure.

Next, at 712, the process chamber may be purged using an inert gas. The inert gas may be any inert gas, for example, such as argon, helium, neon, nitrogen or the like. In some embodiments, the inert gas may be the same, or alternatively, may be different from the inert gas provided to the process chamber during previous process routines. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of greater than 0 to about 10,000 sccm to purge the process chamber.

While the generic embodiment of the processing method shown in the Figure includes only two pulses of reactive gases, it will be understood that this is merely exemplary and that additional pulses of reactive gases may be used. For example, a nitride film may be grown by a first pulse containing a metal precursor gas, a second pulse with a reducing agent, and a third pulse of nitrogen for nitridation. The pulses can be repeated in their entirety or in part. For example all three pulses could be repeated or only two can be repeated. This can be varied for each cycle.

The deposition process can be thermal or plasma enhanced and the addition of a plasma can be used with either. While not illustrated in the Figure, in some embodiments, the substrate is exposed to a plasma. In some embodiments, the plasma comprises a plasma one or more of $O_2$, $H_2$ or $H_2O$. In some embodiments, the substrate is exposed to a plasma of the reactant. In some embodiments, the plasma comprises a plasma of inert, diluent or carrier gases, including but not limited to nitrogen, argon, or helium. The plasma can be a direct plasma or remote plasma. The reactant plasma can be a conductively coupled plasma (CCP) or inductively coupled plasma (ICP).

Next, at 714, it is determined whether the ruthenium containing layer has achieved a predetermined thickness. If the predetermined thickness has not been achieved, the method 700 returns to 704 to continue forming the ruthenium containing layer until the predetermined thickness is reached. Once the predetermined thickness has been reached, the method 700 can either end or proceed to 716 for optional further processing (e.g., bulk deposition of another metal film). In some embodiments, the ruthenium containing layer may be deposited to form a total layer thickness of about 10 to about 10,000 Å, or in some embodiments, about 10 to about 1000 Å, or in some embodiments, about 50 to about 5,000 Å.

Some embodiments of the disclosure are directed to methods of depositing ruthenium containing films. The ruthenium containing films of some embodiments comprises one or more of ruthenium metal, ruthenium oxide, ruthenium nitride, and/or ruthenium oxynitride. Those skilled in the art will understand that the film deposited may have a nonstoichiometric amount of metal, oxygen, and/or nitrogen atoms on an atomic basis.

In some embodiments, the ruthenium containing film comprises greater than or equal to about 95 atomic percent ruthenium, greater than or equal to about 97 atomic percent ruthenium, greater than or equal to about 98 atomic percent ruthenium, greater than or equal to about 99 atomic percent ruthenium, or greater than or equal to about 99.5 atomic percent ruthenium. In one or more embodiments, the sum of C, N and O atoms is less than or equal to about 5 atomic percent, less than or equal to about 3 atomic percent, less than or equal to about 2 atomic percent, less than or equal to about 1 atomic percent, or less than or equal to about 0.5 atomic percent, of the ruthenium containing film.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A selective deposition method comprising:
   exposing a substrate comprising a conductive material having a first surface and an insulating material having a second surface to a ruthenium precursor; and
   exposing the substrate to a reactant comprising one or more of $O_2$, $H_2$ or $H_2O$, wherein the substrate is maintained at a predetermined temperature, when the predetermined temperature is greater than or equal to about 250° C. ruthenium selectively deposits on the first surface over the second surface, when the predetermined temperature is less than or equal to about 200° C. ruthenium selectively deposits on the second surface over the first surface, and ruthenium is deposited with a selectivity greater than or equal to 5:1.

2. The method of claim 1, wherein the conductive material comprises a metal, a metal nitride, a metal oxide or a combination thereof.

3. The method of claim 2, wherein the conductive material comprises one or more of Cu, Co, W, Ta, Ti or oxides, nitrides or oxynitrides thereof.

4. The method of claim 1, wherein the insulating material comprises silicon.

5. The method of claim 4, wherein the insulating material comprises one or more of $SiO_2$, SiN or high resistance Si.

6. The method of claim 1, wherein the conductive material consists essentially of W and the insulating material consists essentially of $SiO_2$.

7. The method of claim 1, wherein the conductive material consists essentially of TiN and the insulating material consists essentially of SiN.

8. The method of claim 1, wherein the ruthenium precursor comprises at least one cyclopentadienyl ligand or a derivative thereof.

9. The method of claim 8, wherein the ruthenium precursor consists essentially of $Ru(Cp)_2$ or $Ru(EtCp)_2$.

10. The method of claim 1, wherein ruthenium selectively deposits on the second surface over the first surface and the substrate is maintained at a temperature in a range of about 25° C. to about 200° C.

11. The method of claim 1, wherein ruthenium selectively deposits on the first surface over the second surface and the substrate is maintained at a temperature in a range of about 250° C. to about 500° C.

12. A selective deposition method comprising:
   exposing a substrate comprising a conductive material having a first surface and an insulating material having a second surface to a ruthenium precursor; and
   exposing the substrate to a reactant comprising one or more of $O_2$, $H_2$ or $H_2O$, wherein the substrate is maintained at a temperature less than or equal to about 200° C. and ruthenium selectively deposits on the second surface over the first surface with a selectivity greater than or equal to 5:1.

13. The method of claim 12, wherein the conductive material comprises one or more of Cu, Co, W, Ta, Ti or oxides or nitrides thereof.

14. The method of claim 12, wherein the insulating material comprises one or more of $SiO_2$, SiN or high resistance Si.

15. The method of claim 12, wherein the conductive material consists essentially of W and the insulating material consists essentially of $SiO_2$.

16. The method of claim 12, wherein the conductive material consists essentially of TiN and the insulating material consists essentially of SiN.

17. The method of claim 12, wherein the ruthenium precursor comprises at least one cyclopentadienyl ligand or a derivative thereof.

18. The method of claim 17, wherein the ruthenium precursor consists essentially of $Ru(Cp)_2$ or $Ru(EtCp)_2$.

* * * * *